United States Patent [19]

Forschirm

[11] Patent Number: 5,094,713

[45] Date of Patent: Mar. 10, 1992

[54] PROCESS FOR IMPROVING THE ADHESION TO POLYACETAL ARTICLES

[75] Inventor: Alex Forschirm, Parsippany, N.J.

[73] Assignee: Hoechst Celanese Corporation, Somerville, N.J.

[21] Appl. No.: 156,216

[22] Filed: Feb. 16, 1988

[51] Int. Cl.$^5$ ............................................. B05D 5/00
[52] U.S. Cl. .................................. 156/668; 252/79.2; 65/60.3
[58] Field of Search ................. 156/668; 252/79.2; 65/60.3

[56] References Cited

U.S. PATENT DOCUMENTS

| | | | |
|---|---|---|---|
| 4,151,126 | 4/1979 | Adelman et al. | 264/129 |
| 4,418,162 | 11/1983 | Kasuga et al. | 524/422 |
| 4,526,735 | 7/1985 | Norota et al. | 264/176.1 |
| 4,566,931 | 1/1986 | Panoch et al. | 428/246 |
| 4,579,882 | 4/1986 | Kanbe et al. | 252/513 |
| 4,585,689 | 4/1986 | Ohta et al. | 427/109 |
| 4,608,428 | 8/1986 | Shalaby et al. | 528/192 |
| 4,618,522 | 10/1986 | Modic | 428/141 |
| 4,664,983 | 5/1987 | Nakamura et al. | 427/307 |
| 4,683,162 | 7/1987 | Sklarski et al. | 428/184 |
| 4,683,280 | 7/1987 | Ukachi et al. | 528/71 |
| 4,696,725 | 9/1987 | Ochiai et al. | 264/24 |

Primary Examiner—David A. Simmons
Assistant Examiner—Thi Dang
Attorney, Agent, or Firm—Herbert P. Price

[57] ABSTRACT

Glass containing polyacetal articles are first etched in an acid bath and then treated with an organosilane or titanate to improve adhesion to the articles. Such treated articles can be more easily coated with adhesives than non-treated articles.

36 Claims, No Drawings

PROCESS FOR IMPROVING THE ADHESION TO POLYACETAL ARTICLES

BACKGROUND OF INVENTION

The field of art to which this invention pertains is polyacetals and a process for improving the adhesion to polyacetal articles.

Polyacetal resins have excellent thermal, mechanical and chemical properties, such as very high strength and toughness per unit weight and good solvent resistance. Due to such properties, polyacetals (polyoxymethylenes) can be used in a wide variety of applications, such as serving as a substitute for metals in certain automobile parts. However, conventional top-coating compositions and primers do not readily adhere to polyoxymethylenes. Generally, polyacetal plastics have low surface energies thereby making it difficult for water or adhesives to wet the surface to form strong bonds. As a result, it is necessary to improve the adhesion to polyacetal structures so that adhesives and coatings can be more readily applied to polyacetal articles. To improve the adhesion, it is necessary to treat polyacetal articles so that plating or coating is more readily achieved. In the prior art, different approaches have been taken in order to improve the adhesion to articles prepared from polyoxymethylenes.

For example, in Canadian Patent No. 744,024, a primer coating composition for acetal plastic surfaces is disclosed. The composition is comprised of a film forming polymer, a phosphoric acid ester, and a boron trifluoride catalyst. The composition is applied to an acetal article and then baked to form a primer coating to which decorative coatings can be applied.

U.S. Pat. No. 3,141,789 discloses a coating composition for coating polyoxymethylene. The composition is comprised of a nitrocellulose, a sulfonamide, a formaldehyde resin former and a non-volatile acid. After the composition is applied to a polyoxymethylene substrate, it is baked to form a coating to which a variety of top coats can be applied.

U.S. Pat. No. 3,595,718 discloses a process for etching plastic surfaces, such as acetal surfaces. A high surface carrier, such as diatomaceous earth, that has been impregnated with an etching agent, such as an organic or inorganic acid, is used to treat a plastic article. The article can be buried in a bed of the impregnated carrier. After treatment, the article is more receptive to coatings.

In U.S. Pat. No. 4,418,162, a method for treating the surface of polyacetal resin articles is disclosed. The article is treated with an acidic solution containing hydrochloric and sulfuric acid. After such treatment, the article can be non-electrically plated with a nickel plating solution. The patent also discloses that the polyacetal resin preferably contains calcium carbonate.

However, none of the patents discloses that a glass containing can be treated with organosilanes and titanates to improve adhesion to the article.

It is an object of this invention to improve adhesion to glass containing polyacetal articles.

It is another object of this invention to facilitate the application of coatings on glass containing polyacetal articles.

It is a further object of this invention to provide a means for uniformly coating glass containing polyacetal articles with adhesives and traditional coatings.

These objects are obtained by the process of this invention.

SUMMARY OF INVENTION

This invention relates to polyoxymethylene or polyacetal articles. In one respect, this invention pertains to polyacetal articles which contain calcium carbonate and glass fibers In another aspect, this invention relates to polyacetal articles which can be modified to improve adhesion to them.

The process for improving the adhesion to a glass containing polyacetal article comprises the steps of:

(1) etching the article in an acid bath comprised of sulfuric acid, concentrated hydrochloric acid and water; and (2) treating the article with an organosilane or titanate.

DESCRIPTION OF INVENTION

The polyacetals that can be employed to prepare the articles of this invention that are modified include the addition homopolymers, copolymers, terpolymers and the interpolymers of aldehydes, such as formaldehyde, and cyclic oligomers, such as trioxane.

The preparation of polyacetals is well known in the art. Generally, aldehydes are polymerized by initiators to form polyacetals. For example, formaldehyde can be polymerized by cationic or anionic initiators, such as common acids and bases, Lewis acids, and amines. The formaldehyde monomer can be readily polymerized either in bulk, from a non-reactive medium, or directly as a vapor. Typically, the homopolymers are prepared by the polymerization of anhydrous formaldehyde or by the polymerization of trioxane, which is a cyclic trimer of formaldehyde.

Trioxane can be used to prepare high molecular weight polyacetal resins by employing cationic initiators either in bulk or dissolved in an inert medium, such as cyclohexane. High molecular weight polyoxymethylenes have also been prepared by polymerizing trioxane in the presence of certain fluoride catalysts, such as antimony fluoride, and may also be prepared in high yields and at rapid reaction rates by the use of catalysts comprising boron fluoride coordinate complexes with organic compounds.

Acetal resins can also be prepared by copolymerization of trioxane and alkylene oxides or by the polymerization of higher aldehydes, such as isobutyraldehydes. Oxymethylene polymers that are particularly adapted for use in the present invention are oxymethylene copolymers, which may be prepared as described in U.S. Pat. No. 3,027,352, which is incorporated herein by reference, by copolymerizing, for example, trioxane with any of various cyclic ethers having at least two adjacent carbon atoms, e.g., ethylene oxide, dioxolane, and the like.

The homopolymers are usually stabilized against thermal degradation by end-capping or the incorporation therein of stabilizer compounds such as described in U.S. Pat. No. 3,133,896. High molecular weight acetal resins can be stabilized through esterification.

Two of the acetal resins that are available commercially are Celcon ® resin, an acetal copolymer of trioxane which is available from Hoechst Celanese Corporation and Delrin ® resin, an acetal homopolymer resin of formaldehyde available from E. I. du Pont de Nemours & Co. The preparation of the Celcon ® resin is described and claimed in U.S. Pat. No. 3,027,352.

It is preferred that the polyacetal resins that are employed in the process of this invention contain calcium carbonate. The presence of calcium carbonate improves the plating adhesion of materials prepared from polyacetal resins. Preferably, the polyacetal resin contains from about one half to ten percent by weight and preferably about three to about five percent by weight calcium carbonate based upon the total weight of the polyacetal resin and calcium carbonate. The presence of calcium carbonate also improves the rigidity of a shaped article prepared from polyacetal resins.

The calcium carbonate suitable for use in the present invention can be light calcium carbonate, chalk or heavy calcium carbonate. Generally, the coarser the particles, the greater the improvement in plating adhesion. However, larger particles tend to reduce the surface gloss of the polyacetal article. In the present invention, calcium carbonate is added to and mixed with the polyacetal resin by any suitable means, such as by extrusion from a single screw extruder, and then the resin is employed to prepare a glass fiber reinforced article.

Generally, any commercially available glass fiber can be employed to prepare a glass reinforced polyacetal resin article. The glass fibers that are utilized are manufactured and marketed commercially. Generally, the fibers are prepared by drawing them from a molten supply of glass contained in a platinum container having a large plurality of very fine holes in the bottom thereof from which the molten glass is drawn at high rates of speed which attenuate the glass into extremely fine diameters. The glass filaments are pretreated as drawn from the platinum container, usually called a "bushing", with a size serving to enhance the compatibility of the glass fibers with a particular thermoplastic fiber or resin with which it will be employed. Preferably, the glass is treated with an organosilane size or a size that is compatible with the polyacetal resins that are employed in this invention.

The glass fibers that are employed generally come in tows having bundle or tow deniers in the range of about one to about 100,000 and filament counts of from 200 to 300,000. Generally, the fibers exhibit a tensile strength of at least about 100,000 psi and a tensile modulus of about 10–120×10 psi. An example of a suitable glass fiber is E glass fiber, such as that available from PPG Industries or OCF. Generally, the commercially available glass fibers come with a coupling agent on them that permits the coupling of the polyacetal resin and the glass fibers. If, however, an additional coupling agent is needed, a minor amount of phenoxide can be employed.

The article should contain about 5 to about 30 percent by weight glass based upon the total weight of the glass containing article and preferably about 20 to about 30 percent by weight. The polyacetal resin and the glass fibers are mixed by any suitable means, such as by extrusion from a single screw extruder. The glass fibers and calcium carbonate can be mixed at the same time by means of an extruder.

Usually, after the glass, calcium carbonate and resin are mixed, the glass containing resin is melt extruded as strands which are then chopped into pellets. The pellets can then be molded to form glass containing polyacetal shaped articles.

After the glass fiber containing polyacetal article is prepared, it is modified by first etching the article in an acid bath so as to expose the glass fibers near the surface of the article. Generally, the bath will contain from about fifteen to about thirty five percent by volume sulfuric acid, about five to about twenty percent by volume concentrated hydrochloric acid and about forty five to about eighty percent by volume water. Preferably, the bath will contain about thirty five percent by volume sulfuric acid, about fifteen percent by volume concentrated hydrochloric acid, and about fifty percent by volume water.

Generally, the bath is at a temperature in the range of about 60° F. to about 90° F., and usually is at the ambient temperature. Preferably, the bath is at a temperature in the range of about 70° F. to about 80° F. The article is held in the acid bath for a time sufficient to expose the glass fibers near the surface of the article. Generally, the time will be about five to about thirty minutes, and preferably about fifteen to about twenty minutes.

After the article is etched by the acid, it is subjected to neutralization and washing with water to remove the acid. Preferably, the article is immersed in a neutralizing bath of sodium hydroxide and then is rinsed with water.

After being etched, the article is treated with an active organosilane or titanate. Generally, any organosilane or titanate that improves the adhesion to the polyacetal article may be employed. The preferred organosilanes used in this invention have the structure:

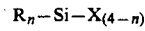

$$R_n-Si-X_{(4-n)}$$

wherein n is an integer of 1 to 3, wherein R is an organic radical containing from 1 to about 20 carbon atoms and having a carbon atom directly linked to the silicon atom, and wherein X is alkoxy, acryloxy, amino or halogen having no carbon-silicon linkage. R can be alkyl, aryl, alkylaryl, arylalkyl, vinyl, allyl, aminoalkyl aminoaryl, aminoalkylaryl, aminoarylalkyl, organic radicals which contain ether, epoxy, ester, acryloxy and methacryloxy groups, and organic radicals which are halogenated. These organosilanes contain at least one group which is not hydrolyzable (i.e. the R group) and at least one group which can be hydrolyzed (i.e. the X group).

Such organosilanes are described in "Silane Coupling Agents" by E. P. Plueddemann, N.Y.: Plenum Press (1982) and in "Silicon Compounds-Register and Review," Petrarch Systems (1987), both of which are incorporated by reference.

Specific examples of suitable organosilanes include vinyltrimethoxysilane, 3-glycidoxypropyl trimethoxysilane, 3-amino propyltriethoxysilane, 3-(N-styrylmethyl-2-amino-ethylamino) propyl trimethoxy silane hydrochloride, N-(3-trimethoxysilylpropyl)-N-methyl-N, N-diallyl ammonium chloride, and trimethoxysilylpropylisothiouronium chloride.

The preferred titanates are selected from the group consisting of titanium alkoxides and aryloxides (i.e. alkyl and aryl titanates), titanium alkoxyhalides, titanium chelates, such as glycol and dicarboxylic acid titanates, and aminoalkyl titanates. Specific examples of such titanates include titanium ethoxide, tetraisopropyl titanate, tris(methacryl)isopropyl titanate, monomeric and polymeric titanium butoxide, and tetraoctylene glycol titanate. The preparation of these organosilanes and titanates is well known in the art, and they are readily available commercially.

The glass reinforced polyacetal article is treated with an organosilane or titanate by immersing the article in a bath or solution containing about 0.5 to about 5 percent by weight organosilane or titanate based upon the total weight of the bath or solution containing the organosilane or titanate and preferably about 1 to about 3 percent.

The solution can be prepared by dissolving or mixing the organosilane or titanate in any suitable solvent or mixture of suitable solvents that does not react with the polyacetal resin or adversely affect the article. Examples of suitable solvents include alcohols, such as methanol, ethanol, isopropanol, and water for the organosilanes and dry alcohols, such as dry butanol, hexane, and toluene for titanates.

When an organosilane solution is prepared, it is usually adjusted to a pH in the range of about 4.0 to about 6.0 and preferably about 4.5 to about 5.5 by the addition of an acid, such as acetic acid, so that hydrolysis and silanol formation can take place.

The article is immersed in the solution for a period of time in the range of about 1 to about 5 minutes and preferably 2 to about 3 minutes. After being removed from the solution, the article is allowed to dry.

The treatment of polyacetal articles with organosilanes and titanates improves the adhesion properties of glass containing polyacetal articles and enables the articles to be adhered to or bonded with other polyacetal articles or resins and with adhesives such as epoxies, urethanes, polyamids, acrylates, and ethylene vinyl acetate Such adhesives can be applied by conventional methods, such as spraying the article with or dipping the article into a solution containing the adhesive, to yield a uniform coating. The article may also be uniformly coated in a similar manner with paints and traditional coatings.

In addition, the article may be plated with a variety of metals, such as nickel or copper, by any conventional means, such as by employing electroless nickel phosphorous or electroless copper baths.

The invention is illustrated by the following examples.

EXAMPLE 1

To 73 grams of Celcon® resin, which is an acetal copolymer available from Hoechst Celanese Corporation are added 2 grams of calcium carbonate and 25 grams of chopped, E-glass fibers having an average length of about three centimeters. The E-glass fiber is 204 filament count and designated as ECG 150 1/0 and has a density of 2.55 g/cc, a tensile strength of 300,000 psi, a tensile modulus of $10.5 \times 10^6$ psi, an ultimate elongation of 2.8 percent and is obtained from PPG Industries. The resin, calcium carbonate and glass are mixed by extrusion from a single screw extruder. The glass fiber mixture is then melt extruded in a reciprocating screw injection molding machine at a temperature of about 200° C. to prepare a shaped article. The article is then placed for fifteen minutes in a 77° F. acid bath. The bath is comprised of 35% by volume sulfuric acid, 15% by volume concentrated (36%) hydrochloric acid and 50% by volume water based upon the total volume of the bath. After fifteen minutes, the glass fibers near the surface of the article ar exposed. The article is then removed from the bath and immersed in a sodium hydroxide bath to neutralize the acid. The article is then rinsed with water and dried.

Next, the article is treated with (3-glycidoxypropyl) trimethoxysilane by dipping the article in a solution of 2% by weight of the silane in a 95% ethanol/5% water solution, adjusted to a pH of 4.5 to 5.5 with acetic acid, in which hydrolysis and silanol formation have taken place. After about 5 minutes of immersion, the article is rinsed free of excess material with ethanol and oven cured for about 10 minutes at about 110° C. After treatment with the organosilane, the article is dipped in a white epoxy base-d paint to yield a uniform coating on the article. After curing, the adhesion to the article is better than the adhesion of an epoxy coating to a non-treated article.

EXAMPLE 2

Example 1 is repeated except that the article is plated with a nickel coating after being treated with the organosilane. The nickel coating is applied by immersing the article into an electroless nickel-phosphorous bath obtained from MacDermid, Inc. After 7 minutes, a uniform nickel coating is achieved and the article is removed from the bath and allowed to dry. The adhesion to the article is better than the adhesion of a nickel coating to a non-treated article.

What is claimed is:

1. A process for improving the adhesion to a glass fiber containing polyacetal article comprising the steps of:
   (1) etching the article in an acid bath comprised of sulfuric acid, concentrated hydrochloric acid and water; and then
   (2) immersing the article in an organosilane or titanate containing solution.

2. The process of claim 1 wherein the acid bath is comprised of about 15 to about 35 percent by volume sulfuric acid, about 5 to about 20 percent by volume concentrated hydrochloric acid and about 45 to about 80 percent by volume water based upon the total volume of the bath.

3. The process of claim 1 wherein the acid bath is comprised of about 35 percent by volume sulfuric acid, 15 percent by volume concentrated hydrochloric acid, and about 50 percent by volume water, based upon the total volume of the bath.

4. The process of claim 1 wherein the article is kept in the acid bath for a period of time in the range of about 5 to about 30 minutes.

5. The process of claim 4 wherein the time is about 15 to about 20 minutes.

6. The process of claim 1 wherein the temperature of the bath is in the range of about 60° F. to about 90° F.

7. The process of claim 6 wherein the temperature of the bath is in the range of about 70° F. to about 80° F.

8. The process of claim 1 wherein the immersion step is carried out with an organosilane and wherein the organosilane has the structure:

wherein n is an integer from 1 to 3, wherein R is an organic radical containing from 1 to about 20 carbon atoms and having a carbon atom linked directly to the silicon atom, and wherein X is alkoxy, acryloxy, amino or halogen having no carbon-silicon linkage.

9. The process of claim 1 wherein the immersing step is carried out with a titanate and wherein the titanate is selected from the group consisting of titanium alkoxides and aryloxides, titanium alkoxyhalides, titanium chelates, and aminoalkyl titanates.

10. The process of claim 1 wherein the article is coated after being immersed in the organosilane or titanate solution.

11. The process of claim 1 wherein the article is plated with a metal after being immersed in the organosilane or titanate solution.

12. The process of claim 1 wherein the glass fiber containing polyacetal article contains about 5 to about 30 percent by weight glass fibers based upon the total weight of the article.

13. The process of claim 12 wherein the article contains about 20 to about 30 percent by weight glass fibers.

14. The process of claim 1 wherein the glass fiber containing article contains about ½ to about 10 percent by weight calcium carbonate based upon the total weight of the polyacetal resin and calcium carbonate in the article.

15. The process of claim 14 wherein the article contains about 3 to about 5 percent by weight calcium carbonate based upon the total weight of the polyacetal resin and calcium carbonate in the article.

16. The process of claim 1 wherein the article is immersed in a solution containing about 0.5 to about 5 percent by weight organosilane or titanate based upon the total weight of the solution containing the organosilane or titanate.

17. The process of claim 16 wherein the solution contains about 1 to about 3 percent by weight organosilane or titanate.

18. The process of claim 16 wherein the article is immersed in the solution for a period of time in the range of about 1 to about 5 minutes.

19. The process of claim 18 wherein the time is in the range of about 2 to about 3 minutes.

20. A process for improving the adhesion to a polyacetal glass fiber containing article comprising the steps of:
  (1) etching the article in an acid bath comprised of about 15 to about 35 percent by volume sulfuric acid, about 5 to about 20 percent by volume concentrated hydrochloric acid, and about 45 to about 80 percent by volume water based upon the total volume of the bath; and then
  (2) immersing the article in an organosilane or titanate containing solution; and wherein the glass fiber containing article contains about 5 to about 30 percent by weight glass fibers based upon the total weight of the article.

21. The process of claim 20 wherein the acid bath is comprised of about 35 percent by volume sulfuric acid, 15 percent by volume concentrated hydrochloric acid, and about 50 percent by volume water based upon the total volume of the bath.

22. The process of claim 20 wherein the article is kept in the acid bath for a period of time in the range of about 5 to about 30 minutes.

23. The process of claim 20 wherein the time is about 15 to about 20 minutes.

24. The process of claim 20 wherein the temperature of the bath is in the range of about 60° F. to about 90° F.

25. The process of claim 20 wherein the temperature of the bath is in the range of about 70° F. to about 80° F.

26. The process of claim 20 wherein the immersing step is carried out with an organosilane and wherein the organosilane has the structure:

$$R_n-Si-X_{(4-n)}$$

wherein n is an integer from 1 to 3, wherein R is an organic radical containing from 1 to about 20 carbon atoms and having a carbon atom linked directly to the silicon atom, and wherein X is alkoxy, acryloxy, amino or halogen having no carbon-silicon linkage.

27. The process of claim 20 wherein the immersing step is carried out with a titanate and wherein the titanate is selected from the group consisting of titanium alkoxides and aryloxides, titanium alkoxyhalides, titanium chelates, and aminoalkyl titanates.

28. The process of claim 20 wherein the article is coated after being immersed in the organosilane or titanate solution.

29. The process of claim 20 wherein the article is plated with a metal after being immersed in the organosilane or titanate solution.

30. The process of claim 20 wherein the glass fiber containing article contains about ½ to about 10 percent by weight calcium carbonate based upon the total weight of polyacetal resin and calcium carbonate in the article.

31. The process of claim 20 wherein the article contains about 3 to about 5 percent by weight calcium carbonate based upon the total weight of the polyacetal resin and calcium carbonate in the article.

32. The process of claim 20 wherein the article contains about 20 to about 30 percent by weight glass fibers.

33. The process of claim 20 wherein the article is immersed in a solution containing about 0.5 to about 5 percent by weight organosilane or titanate based upon the total weight of the solution containing the organosilane or titanate.

34. The process of claim 33 wherein the solution contains about 1 to about 3 percent by weight organosilane or titanate.

35. The process of claim 33 wherein the article is immersed in the solution for a period of time in the range of about 1 to about 5 minutes.

36. The process of claim 35 wherein the time is in the range of about 2 to about 3 minutes.

* * * * *